(12) United States Patent
Sinclair et al.

(10) Patent No.: US 6,462,107 B1
(45) Date of Patent: Oct. 8, 2002

(54) PHOTOIMAGEABLE COMPOSITIONS AND FILMS FOR PRINTED WIRING BOARD MANUFACTURE

(75) Inventors: David P. Sinclair, Winfield, IL (US); Douglas E. Fjare, Naperville, IL (US); John T. Hoback, Naperville, IL (US); Terre L. VanKirk, Saint Charles, IL (US); Donald E. Rubis, Somonauk, IL (US); David A. Wargowski, Naperville, IL (US); Wen-Feng Liu, Naperville, IL (US); Paul A. Sanchez, Lisle, IL (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 09/218,998

(22) Filed: Dec. 22, 1998

Related U.S. Application Data

(60) Provisional application No. 60/068,759, filed on Dec. 23, 1997.

(51) Int. Cl.[7] .............................................. C08K 5/00
(52) U.S. Cl. ................................................... 523/456
(58) Field of Search ....................................... 523/456

(56) References Cited

U.S. PATENT DOCUMENTS

| | | | |
|---|---|---|---|
| 3,496,072 A | 2/1970 | Meyers | 204/15 |
| 3,782,939 A | 1/1974 | Bonham et al. | 96/35.1 |
| 3,934,335 A | 1/1976 | Nelson | 29/625 |
| 4,193,797 A | 3/1980 | Cohen et al. | 430/258 |
| 4,247,616 A | 1/1981 | Vikesland et al. | 430/192 |
| 4,413,051 A | 11/1983 | Thomas | 430/312 |
| 4,456,679 A | 6/1984 | Leyrer et al. | 430/326 |
| 4,554,229 A | 11/1985 | Small, Jr. | 430/17 |
| 4,556,628 A | 12/1985 | Greschner et al. | 430/314 |
| 4,571,374 A | 2/1986 | Vikesland | 430/166 |
| 4,576,902 A | 3/1986 | Saenger et al. | 430/326 |
| 4,579,885 A | 4/1986 | Domeier et al. | 523/400 |
| 4,596,759 A | 6/1986 | Schupp et al. | 430/271 |
| 4,629,777 A | 12/1986 | Pfeifer | 528/353 |
| 4,649,100 A | 3/1987 | Leyrer et al. | 430/326 |
| 4,657,832 A | 4/1987 | Pfeifer | 430/18 |
| 4,672,020 A | 6/1987 | Koelsch et al. | 430/166 |
| 4,786,569 A | 11/1988 | Rohde et al. | 430/14 |
| 4,789,622 A | 12/1988 | Leyrer et al. | 430/286 |
| 4,888,450 A | 12/1989 | Lando et al. | 174/68.5 |
| 4,902,610 A | 2/1990 | Shipley | 430/312 |
| 5,035,939 A | 7/1991 | Conlon et al. | 428/137 |
| 5,055,378 A | 10/1991 | Miyamura et al. | 430/280 |
| 5,077,174 A | 12/1991 | Bauer et al. | 430/270 |
| 5,120,633 A | 6/1992 | Bauer et al. | 430/176 |
| 5,137,618 A | 8/1992 | Burnett et al. | 205/125 |
| 5,145,764 A | 9/1992 | Bauer et al. | 430/260 |
| 5,246,817 A | 9/1993 | Shipley, Jr. | 430/312 |
| 5,260,170 A | 11/1993 | Brown | 430/315 |
| 5,262,281 A | 11/1993 | Bauer et al. | 430/323 |
| 5,270,146 A | 12/1993 | Tara | 430/259 |
| 5,322,976 A | 6/1994 | Knudsen et al. | 174/262 |
| 5,405,731 A | 4/1995 | Chandrasekaran et al. | 430/260 |
| 5,418,689 A | 5/1995 | Alpaugh et al. | 361/792 |
| 5,545,510 A | 8/1996 | Kukanskis et al. | 430/312 |
| 5,654,126 A | 8/1997 | Kukanskis et al. | 430/312 |

FOREIGN PATENT DOCUMENTS

| | | | |
|---|---|---|---|
| EP | 0087262 | 2/1983 | G03C/1/52 |
| EP | 0211180 | 6/1986 | H05K/3/46 |
| EP | 0478313 | 9/1991 | H05K/3/46 |
| EP | 0478313 | 4/1992 | H05K/3/46 |
| EP | 0768559 | 4/1997 | G02F/1/1337 |
| FR | 2309896 | 4/1976 | G03C/1/60 |
| GB | 2140628 | 4/1984 | H05K/3/46 |

OTHER PUBLICATIONS

Derwent Abstract of Japanese Patent No. 910035617.
Derwent Abstract of Japanese Patent No. 760124207.
Glycidyl Ether Reactions with Amines, Leon Shechter, John Wynstra, and Raymond P. Kurkjy, Industrial and Engineering Chemistry, vol. 48.
Effect of Hydroxyl Compounds on Reactivity of Epoxy Resins, David O. Bowen and Ross S. Whiteside, Jr., Amer. Chem. Journal, vol. 92 (1970), pp. 48–59.
Controllable Reactivity Epoxy Resin Hardeners, Mark Markovitz, General Electric Company, Chem. Prop. of Crosslinked Polymers Proceeding of ACS Symp, 1976, pp. 49–58.
A Study of Accelerators for Epoxy–Amine Condensation Reaction, A. M. Partansky, Western Division of Dow Chemical Company, Amer. Chem. Soc. Adv. Chem. Series, vol. 92 (1970), pp. 28–47.
Negative and Positive Acting High Temperature Stable Resists Based on Soluble 6–F–Polyimides/Amides, D. N. Khanna and W. H. Mueller, 3rd International SAMPE Electronics Conference, Jun. 20–22, 1989, pp. 905–918.

*Primary Examiner*—Edward J. Cain
(74) *Attorney, Agent, or Firm*—Baker Botts, L.L.P.

(57) ABSTRACT

Compositions for forming polymeric layers useful in the manufacture printed wiring boards and other electrical interconnecting devices are disclosed. The compositions typically are processable in aqueous base and can be made photosensitive with the addition of a positive acting photosensitive compound. The compositions are particularly useful in the manufacture of laminable films used to make printed wiring boards. Multilayer printed wiring boards made using such films, and methods for making and using the films and boards, also are disclosed.

22 Claims, No Drawings

PHOTOIMAGEABLE COMPOSITIONS AND FILMS FOR PRINTED WIRING BOARD MANUFACTURE

This application claims the benefit of U.S. Provisional Patent Application Serial No. 60/068,759 filed Dec. 23, 1997.

FIELD OF THE INVENTION

The invention relates to compositions useful for producing polymer layers on printed wiring boards and other electronic and electrical interconnect devices. In many embodiments, the invention relates to photosensitive, positive-acting, aqueous-processable dry films made from those compositions. The films are particularly useful for forming a permanent dielectric on multilevel printed wiring boards.

BACKGROUND OF THE INVENTION

Consumer demand for smaller, lighter electronic products has caused product manufacturers to require smaller semiconductor packages with increased levels of functional integration. These smaller, highly integrated packages require printed wiring boards having a large number of interconnection paths per unit board area. Frequently, multilayer printed wiring boards are required to achieve the "high density" of interconnection required to support these highly integrated packages.

Multilayer, high density printed wiring boards consist of alternating layers of electrically insulating polymeric material and metallic conductors which have been deposited on a copper-clad glass-epoxy substrate. Connections between metallic conductor layers are made through a plurality of tiny holes or "vias" in the polymer layer located between two conductor layers.

A two layer printed wiring board, for example, can be produced by first etching a circuit board pattern on the upper surface of a copper-clad glass epoxy substrate. An electrically insulating polymer layer is then deposited on the patterned surface, and holes are made through the polymer layer at desired points of conductor interconnection. An electrically conductive layer is then deposited on top of the polymeric layer, with the deposited conductive layer penetrating the vias to form electrical connections between the deposited layer and the circuit board traces on the glass epoxy substrate. A patterned conductive layer is then formed from the deposited conductive layer via a multistep photoetching process, resulting in two levels of circuit traces interconnected by the copper that was deposited within the vias.

Increased board interconnect density requires vias in a circuit board's dielectric polymer layer that are smaller than can be economically achieved by conventional mechanical through-hole drilling. Vias smaller than what can be achieved by conventional mechanical drilling, typically 6 mils or less, are referred to as "microvias". High density boards currently in production require microvias having diameters of about 3 to 5 mils.

Board manufacturers produce microvias by laser ablation, plasma etching, or photoimaging techniques.

Laser ablation is a sequential via formation technique. Vias are formed one at a time as a laser pulse is directed at a specific area of the circuit board. The etching process is anisotropic, which inherently limits resolution of the produced microvias. Because resolution is limited, and because sequential production processes are relatively slow compared to other processes, laser ablation is not preferred by board manufacturers.

Unlike laser ablation, photoimaging and plasma etching mass produce all of a given board level's microvias simultaneously. Photoimaging techniques are more cost effective for mass producing high density wiring boards than plasma etching, and therefore are preferred by printed wiring board manufacturers for boards having high microvia densities.

In a photoimaging process, microvias are produced by positioning a pattern or "mask" over a photosensitive polymer surface, exposing the masked polymer surface to actinic radiation, and then developing the surface to remove polymer from the board.

If the photosensitive polymer is made insoluble by exposure to actinic light, the coating is said to be "negative acting." In this case, the developer dissolves the unexposed polymer surface, leaving an image of polymer on the board that is a negative of the image on the mask. On the other hand, if the polymer is rendered soluble by exposure to actinic light, the polymer coating is said to be "positive acting." In a positive acting system, the developer removes the exposed polymer, leaving a positive image of the mask.

Positive acting polymeric materials are preferred in photopolymer applications because they provide improved resolution and yields.

Improved via resolution occurs because, unlike negative acting materials, positive acting materials do not swell during development.

If used in printed wiring board applications, board yields can be higher using positive acting systems for two reasons. First, if a dust particle is present during exposure in an unmasked area of a board bearing a negative acting polymer, the end result will be that an undesired via will be formed. As the undesired via will provide an undesired electrical connection between adjacent conductive layers of the board, the board is unusable. On the other hand, if the dust particle is present when a positive acting photosensitive polymer is exposed, the end result will be a spot of insulating dielectric material in an undesired location. Often, the presence of a small spot of additional dielectric will not spoil the board. Second, if an undesired spot will spoil a board manufactured using a positive acting material, the coating may be stripped from the board simply by developing under more severe conditions, and the layer can be remanufactured. Alternatively, the spot can be removed by reexposure to light followed by redevelopment of the board. Similar reworking is not practical with negative acting coatings because the coatings are rendered insoluble (and unworkable) by the exposure process. The use of positive acting materials can, therefore, greatly increase board yield. Consequently, board manufacturers prefer to work with a positive acting polymer system.

Another important factor in selecting a polymer system for printed wiring board manufacture is the type of material used to develop photoimaged boards. While many polymers will be soluble in a wide range of organic developers, the use of organic developers may present occupational hazards to workers. Furthermore, disposing of waste organic materials can be expensive. For these reasons it is preferred that polymer systems used in printed wiring board manufacture be developable in aqueous solutions.

Yet another requirement for polymer systems used to form a permanent dielectric layer on printed wiring boards is that the polymer system exhibit good mechanical properties at sufficiently high temperature to withstand subsequent board manufacture and soldering steps. One method to ensure good mechanical properties at high temperature is for the permanent dielectric layer to have a high glass transition temperature. Typically, the circuit boards will be required to withstand temperatures of at least 125 degrees Centigrade, and in some applications, as high as 200 degrees Centigrade. Polymer systems selected for board use must therefore have a relatively high glass transition temperature.

Polymer system selection also depends on the desired method of application of the polymer to the circuit board. Photosensitive polymer systems typically are applied to printed wiring boards as a liquid or as a dry film. In either case, an important requirement is that each cured polymer surface be essentially flat to enable the application of subsequent board layers. Such a flat surface is said to "planar" or possess a high "degree of planarity."

Liquid polymer coatings are difficult to use in printed wiring board manufacture for at least two reasons. First, liquid coatings are difficult to apply and dry to the uniform thicknesses and degree of planarity desired by printed wiring board manufacturers. This problem is especially pronounced when manufacturing built up multilayer printed wiring boards where alternating layers of conductive and insulating materials are sequentially applied to the printed wiring board substrate. Additionally, liquid coatings can trap foreign objects such as dust particles and continue to trap such objects until the liquid has solidified.

A high degree of planarity is not easily obtained when applying a film over a board layer either, but improved planarity can be obtained by making the dry film layer relatively thick. The required thickness typically will be on the order of 1 mil or more. Films of this thickness or greater also are desirable because they provide good insulating properties and will provide a high degree of planarity.

Thick dry films of the type just discussed also are preferred because they can readily conform to circuit elements present on the circuit board. The dry film must conform to the circuit elements because any void formed between the applied polymer layer and the metallic circuit element will lead to board degradation when heat is applied to the board during subsequent thermal processing and soldering steps. Voids of this type also can lead to failure of the board or mounted devices after assembly. For these reasons many printed wiring board manufacturers prefer to manufacture printed wiring boards by pressure laminating dry film layers of polymeric coating precast on carrier sheets to printed wiring board substrates. Such laminating processes are not possible using liquid coatings.

Finally, dry film materials used to prepare printed wiring boards must exhibit favorable material handling characteristics when used in the typical printed wiring board preparation environment. For example, the dry film layer must be sufficiently pliable that it does not develop cracks when the dry film carrier sheet flexes during handling. The dry film layer also must maintain sufficient integrity to prevent flaking of material from the dry film layer, as such flaking can interfere with photoimaging of the dry film material.

Thus, printed wiring board manufacturers continue to search for improved polymer systems that can be used to form a permanent dielectric in printed wiring boards. The system should be capable of being applied to the circuit board as a dry film system, be positive acting, and be able to be developed in aqueous solutions. The system also should have a high Tg, be able to be applied in thicknesses greater than 1 mil so that it may readily conform to circuit board elements while providing a high degree of planarity, and be able to be photoimaged to produce microvias that can have a diameter of 3 mils or less. Preferably, the dry film material will be highly pliable and will not flake in use.

SUMMARY OF THE INVENTION

We have discovered that certain epoxy-based formulations can be used to produce positive acting, aqueous developable dry films and coatings useful for a wide range of applications related to the interconnection of electrical and electronic components.

The coatings and films of our invention are highly conformal to electrical circuit elements, exhibit high degrees of planarity in use, can be used in thickness in excess of 1 mil, and can provide good photoresolution. Preferred formulations are highly resistant to flaking and exhibit a high degree of pliability, rendering the coatings and films exceptionally easy to use in a printed wiring board production environment.

A first embodiment of our invention is a composition for forming a polymeric layer useful in the production of printed wiring boards. The composition includes a volatile organic carrier solution for mixing and casting the polymeric layer onto a surface, an epoxy resin in the amount of 20 to 60 weight percent of the nonvolatile components of the layer, a basic catalyst in the amount of 0.01 to 5 weight percent of the nonvolatile components of layer, and a film-forming polymer adduct totaling between 10 and 50 weight percent of the nonvolatile components of the layer. Preferably, the film-forming polymer adduct includes a polyfunctional nucleophile such as a diamine, a dianhydride or a novolac.

The composition can be made photosensitive by including a positive acting photosensitive agent, and can be used to prepare laminable dry films for printed wiring board production by casting the composition on a carrier sheet coated with a release agent, drying the cast composition to drive off most of the carrier solvent, laminating the carrier sheet bearing the dry film to a circuit board, removing the carrier sheet, patterning the deposited dry film material that remains adhered to the circuit board, and heating the patterned composition to cure the thermsetting composition. Reactive liquid polymers, stress-modified phenolic resins, or rubbers can be added to the composition to increase pliability and reduce flaking of the cast and dried dry film material.

In another embodiment of our invention, a laminable dry film able to be developed in aqueous alkaline solution and useful for forming a permanent dielectric area on a printed wiring board surface includes a first thermosetting polymeric layer for adhering the film to the printed wiring board surface and for encapsulating circuit board elements. A second thermosetting polymeric layer is adhered to the first layer and includes a positive-acting photosensitive agent for increasing the solubility of the second layer in aqueous base after exposure to actinic radiation. The thermosetting film layers are formed from the compositions just described, and the bilayer films are capable of producing printed wiring board dielectric areas having a high degree of planarity and via resolution of 3 mils or less.

In still another embodiment of the invention, a structure is formed by laminating a film such as the film described above to a printed wiring board already having a patterned conductive layer on its surface. A multilayer printed wiring board then can be formed by exposing the laminated film to actinic light through a photomask, developing the exposed film to remove the first and second polymeric layers from the exposed board area to form microvias, depositing an electrically conductive layer onto the developed surface of the board, and patterning the conductive layer deposited on the board to form a second patterned conductive board layer interconnected to the first.

In yet another embodiment of the invention, a process for making a bilayer film is disclosed in which a first film layer is cast on to a first carrier sheet, a second polymer layer is cast on a second carrier sheet, and then the two film layers joined together. This process can result in better drying of film layers and enable the use of certain film layer compositions that could not be used if the film layers were sequentially applied to a carrier sheet and then dried.

Another embodiment of the invention is a process for plating a printed wiring board made from a photosensitive dry film material. In this process, an electrically conductive layer is deposited on a partially cured, roughened surface. By roughening a partially cured surface prior to plating, it is possible to obtain better metal to polymer adhesion.

Other embodiments of the invention incorporate sacrificial or non-etchable fillers in the dry film material to promote adhesion of metal to photoprocessed boards made from our films and coatings.

DETAILED DESCRIPTION OF THE PREFERRED EMBODIMENT

The following detailed descriptions of our invention illustrate how the invention can be used in a dry film useful for forming permanent dielectric areas on built-up multilayer circuit boards. While the description will focus on the use of the invention in the form of photosensitive film layers that can be used alone or in conjunction with similar nonphotosensitive film layers to make built-up multilayer circuit boards, those of ordinary skill will realize that the invention will be useful in a wide variety of coating or film applications, such as a photoresist, soldermask, flexible circuit coverlay, the production of substrates for devices such as ball grid arrays, or in any other application where a photoimageable polymer is required to be applied to a substrate.

In its broadest embodiment, our invention comprises thermosetting compositions that can be cast onto or otherwise applied to a carrier sheet or other substrate to form an uncured thermosetting polymeric layer of material. Addition of a photosensitive agent to the composition will yield a photoprocessable film layer. The film may have any thickness from about 0.1 to 10 mils, although a total film thickness of at least 1.5 mils is currently preferred by the printed wiring board industry to provide adequate dielectric properties and to provide for a planar upper film surface. Maximum film thickness typically will be limited by the resolution required in the particular application. In built-up multilayer board applications, the film thickness usually does not need to exceed about 4 mils.

While the invention may take the form of a single layer of photosensitive thermosetting material, we have found that it is preferred to produce photoprocessible films in accordance with the invention as bilayered, thermosetting films. In these embodiments, the invention takes the form of a release-coated polyester carrier film onto which are applied a first, photosensitive (PS) layer, and a second nonphotosensitive (NPS) layer.

Solutions useful for casting both photosensitive and non-photosensitive layers of one such bi-layer film contain at least a carrier solvent, a thermosetting epoxy component which typically will include a polyfunctional epoxy resin, a comonomer such as phthalic anhydride, and a basic catalyst or other curing agent. Optional components include a film-forming thermoplastic, a film-forming polymer adduct such as the product of the reaction between a polyisocyanate and a base-soluble phenolic or cresylic novolac having a large stoichiometric excess of the novolac, one or more comonomers for the epoxy resin, an aminoplast such as melamine, and, in a photosensitive layer, a photosensitive compound that increases the solubility of the film layer in aqueous base after exposure to actinic radiation.

Although not required by the invention, solutions used for casting films may also include a wide variety of additives such as organic and inorganic fillers, adhesion promoters, thermal stabilizers, colorants, viscosity control agents, wetting agents, and flexibilizers.

Carrier solvents useful for preparing polymer mixtures for casting film layers in accordance with the invention include virtually any organic solvent or mixtures thereof that are capable of dissolving or solubilizing film layer starting materials and which can be removed substantially by drying the film layer at relatively low oven temperature settings of between about 25 and 150 degrees Centigrade. Preferred oven temperature settings as measured by the air temperature in the oven are between 75 and 140 degrees Centigrade. It should be noted that to produce optimal dried films, a combination of proper solvent choice, oven temperature settings, air flow settings and residence time is required. It should also be noted that the air flow in the oven will significantly impact film drying and may allow properly dried films to be produced even though the boiling point of the solvent may exceed the oven temperature setting. Operating conditions for any particular solvent used in a film composition should be empirically determined by varying oven temperature, air flow and residence time and comparing the results.

Preferred carrier solvents include acetone or other acyclic ketones including methyl ethyl ketone and the like, hydrocarbons such as hexane, cyclohexane, heptane, toluene and the like, esters such as ethyl acetate, isobutyl acetate, methyl proprionate, ethyl ethoxy propionate, propylene glycol ethyl ether acetate, ethyl lactate and the like, and polar aprotic solvents such as gammabutyrolactone, N-methylpyrrolidone, and similar compounds. Other information concerning the selection and use of solvents which may be useful in photosensitive film systems is contained in U.S. Pat. No. 5,128,230, the disclosure of which is hereby incorporated by reference.

The process of casting and drying a film on a carrier sheet normally leaves some carrier solvent remaining in the film. Preferably the retained carrier solvent amounts in the dried film are from about 0.1 to 5 weight percent retained solvent. Depending on what effects are desired, a properly dried film may have retained solvent toward either the higher or lower end of this range. If stable film processing immediately after film casting is desired, for example to provide more stable image development properties, then it is generally preferred to have less retained solvent. If improved film flexibility or laminability is desired, then it is generally preferred to have more retained solvent. We have found that films having the composition of Example 5, below, when cast and dried in an oven using different residence times, produced films having different amounts of retained solvent and strain characteristics. Films having up to 2.2% retained solvent exhibited less than 0.4% strain before failure, as measured by the mandrel test described later in this application, while a film containing 3.5% retained solvent withstood 0.5% strain before failure. Higher retained solvent also may cause increased erosion in freshly cast films, but after aging, film erosion becomes independent of retained solvent amount.

In a relatively thick film containing temperature-sensitive moieties such as the photosensitive moiety, it may be difficult to find drying conditions which give both low residual solvent and do not initiate decomposition of the photosensitive moiety. Thus, it is apparent to one skilled in the art that retained solvent is not the sole measure of a properly dried film. Nevertheless, it may be said that more preferred retained solvent amounts in the dried film are from about 0.3 to 4 weight percent retained solvent. Most preferred retained solvent amounts are from 0.5 to 3.0 weight percent retained solvent. As used in this application, a "dried" film is a film that contains less than 5 weight percent retained solvent after drying as measured by total film weight.

Typical film drying conditions for webs having widths on the order of 1 to 6 feet or more will include web speeds of 5 to 500 feet per minute, drying temperatures of 65 to 150 degrees Centigrade, and air flows on the order of a few thousand feet per minute. Operating conditions preferably should be adjusted to yield a non-tacky film unless an interleaf is used when rolling up the dried film to keep tacky film surfaces separated.

Film-forming polymer adducts useful in the invention will be those that will cause the cast solution to produce a relatively uniform coating on a substrate or traveling web which will maintain its integrity while being dried or devolitalized. As used in this application, the term "film-forming" describes the ability of a solution of plastic materials to uniformly wet a traveling web or substrate and to maintain integrity of the dried film during manufacture and use. In preferred embodiments of the invention, the adduct is formed prior to casting of the film material. Preferred film-forming adducts are urethanes. In forming a film-forming urethane adduct such as from a polyisocyanate and a phenolic novolac, it is preferred to use a stoichiometric excess of phenolic novolac. The mole equivalent excess of novolac should be an amount effective to prevent gelation of the adduct prior to casting the film. Typically, the mole equivalent ratio of phenolic to isocyanate moieties will be at least 5, and preferably is between 10 and 50. If a reactive liquid polymer is employed as discussed in detail below, the mole equivalent of the reactive liquid polymer should be added to the mole equivalent of isocyanate when calculating the novolac to isocyanate ratio. The film-forming adduct constituents should comprise in total between about 10 and 50 weight percent of a film layer's non-volatile components, and preferably will comprise between about 20 and 40 weight percent on that basis.

Film-forming thermoplastics useful in the invention will be those that that can be mixed with the other film components in the carrier solvent and dried without the mixture becoming heterogeneous. The film-forming thermoplastic or mixtures thereof should comprise in total between about 0 and 25 weight percent of a film layer's non-volatile components, and preferably will comprise no more than 5 weight percent on that basis.

Virtually any catalyst known to catalyze copolymerization of the epoxy moieties with nucleophilic curing agents, without interfering with the polymerization of other film constituents, may be used in the invention. Preferred catalysts are heterocyclic amines, tertiary aromatic amines and tertiary-amino phenols with tertiary-amino phenols being more preferred. In many embodiments, the use of 2, 4, 6-tris-[(dimethylamino)methyl] phenol is most preferred. Mixtures of catalysts may be used and in many cases may be preferred. It should be noted that film constituents such as diamines, which are included in the film for primary functions other than their catalytic activity, may perform as catalysts in the film-forming mixture. Catalyst typically should comprise in total up to about 10.0 weight percent of a film layer's non-volatile components, and preferably will comprise between about 0.01 and 5.0 weight percent on that basis.

Epoxy resins useful in the invention include most epoxy resins having two or more glycidyl ether groups. The epoxy should be soluble in the carrier solvent and be capable of polymerization with the other epoxy resins or comonomers used in the film under the desired printed wiring board curing conditions. Exemplary resins include aromatic glycidyl ethers, aliphatic glycidyl ethers, and other resins having at least diglycidyl ether functionality. Preferred epoxy resins are aromatic and aliphatic glycidyl resins having two or more functional groups per molecule. The epoxy resin or mixtures thereof should comprise in total between about 20 and 60 weight percent of a film layer's non-volatile components, and preferably will comprise between about 40 and 60 weight percent on that basis.

Comonomers for epoxy resins also may be included in the film layers of the invention. These comonomers should be selected for compatibility with the other film layer constituents, and can be any of a wide number of comonomers known in the art. The comonomers should have a functionality of two or more under drying and curing conditions. Comonomers containing the following moieties are useful in the invention: Lewis acids and bases, acid anhydrides, primary and secondary amines, acids, esters, alcohols, phenols, epoxides, mercaptans, isocyanates, melamine-, urea-, and phenol-formaldehyde resins. Comonomers such as carboxylic acid anhydrides and dianiline derivatives are preferred. In many embodiments, the use of a comonomer such as phthalic anhydride is most preferred. It may be useful to use two comonomers in combination. Comonomers or mixtures thereof should comprise in total between about 0 and 25 weight percent of a film layer's non-volatile components, and preferably will comprise between about 1 and 10 weight percent on that basis.

The short-term thermal resistance of film layers, as measured by glass transition temperature, is a key property of built-up multilayer dielectric layers in high density circuit boards. The fabricated high density circuit board must have sufficient thermal resistance to survive circuit assembly and use conditions unchanged. For a built-up multilayer circuit, this implies a Tg at least equal to the Tg of the substrate. This is only about 130° C. for an FR-4 substrate. For chip-on-board applications, the interconnect is made by wirebonding the chip to the substrate. This in turn requires a Tg greater than the wirebonding temperature of about 170 to 190° C. In other applications such as flip chips, a sufficiently high Tg may be required to survive the solder reflow temperatures used to mount the flip chip.

The formulation of epoxy resins to meet end use requirements is a complex art. However, those skilled in the art recognize that there are certain guiding principles. Three points to consider are the rigidity of the resin backbone, the perfection of the network, and that the Tg of the epoxy network is a function of the crosslink density. Perfection means a stoichiometric balance of epoxy resin to comonomers and hardeners. We define the stoichiometric ratio to be:

ratio=[(mole equivalents of epoxy)−(mole equivalents of comonomer)]/[(mole equivalents of novolac)−(mole equivalents of isocyanate)].

where the comonomers are, for example, phthalic anhydride, diaminodiphenyl sulfone, and the like. This ratio hereafter will be referred as the "epoxy to novolac ratio." Each film layer optionally includes one or more amino resins or "aminoplasts". Examples of aminoplasts useful in the invention include urea-formaldehyde adducts, melamine-formaldehyde adducts and glycoluril derivatives, with the glycolurils and melamine-formaldehyde adducts being especially preferred. Preferably, the amino resin should be capable of reacting with film-forming adduct constituents such as the novolac or glycidyl ethers during low temperature drying of the manufactured film. The amino resin or mixtures thereof should comprise in total up to about and 10 weight percent of a film layer's non-volatile components, and preferably will comprise between about 0.1 to 2 weight percent on that basis. It is believed that the use of an aminoplast improves image stability during the initial stages of cure.

Photosensitizing compounds useful in the invention include any positive-acting photosensitizers containing an ortho-quinone diazide group. Such compounds include 1,2-naphthoquinone-2-diazido-5-sulfonyl chloride and its esters with phenol, phenolic derivatives, phenolic polymers and the like. Especially preferred are esters of di-and tri-hydroxybenzophenone. Photosensitizing compound should comprise in total between about 2 and 20 weight percent of a photosensitive film layer's non-volatile components, and preferably will comprise between about 5 and 15 weight percent on that basis.

It is generally required that the foregoing compositions be soluble in aqueous base, as the development of photoactivated film layers in accordance with the invention is conducted in aqueous basic developer, typically at a pH of about 11 to 15, and more preferably in a range of 12.5 to 13.5.

We believe that the photoactive compound functions by increasing the solubility of the film in the exposed areas and decreasing the solubility of the film in the unexposed areas. The differential solubility between exposed and unexposed areas is the basic requirement for forming a relief image by exposure and development. More specifically, the presence of photoactive compound in the film creates differential solubility in the film after exposure by increasing the dissolution rate of the film in the exposed areas and decreasing the dissolution rate in the unexposed areas. However, the dissolution rate in the unexposed area is not zero and some film thickness will be lost during development. The amount of film thickness lost during via development is referred to as the film erosion.

It is desirable that the loss of film thickness (erosion) during image development be minimized. The erosion in a film having a single photosensitive layer (PS) is the film thickness lost from the unexposed region during the develop time required to open vias in the exposed region.

Erosion in a bilayer film is more complex because the imaged region consists of both the exposed photosensitive layer and the underlying non-photosensitive (NPS) layer. The NPS layer does not have a solubility differentiation between the exposed and unexposed regions. The erosion in a film having a bilayer construction is the film thickness lost from the unexposed region during the development time required to form a via by dissolving material from the exposed region of the PS layer and the underlying NPS layer. To have satisfactory low erosion in a bilayer film requires an NPS layer having significantly higher solubility than the unexposed PS layer. If the NPS layer does not have significantly higher solubility than the unexposed PS layer, the dissolution rates of the exposed and unexposed areas will become comparable when the developing feature reaches the NPS layer and significant erosion will result. A preferred bilayer film will have a PS layer that develops with low erosion at conditions suitable for rapidly developing the NPS layer. NPS layers can be formulated in the same manner as PS layers, except, of course, for the absence of the photosensitive agent.

While not wishing to be bound by any particular theory, it is believed that the components of our film and coating materials form a polymer network during their manufacture and cure. During drying, it is believed that the aminoplast reacts with itself and with novolac species, thereby stabilizing the dry film. As temperature increases in drying and curing steps, various epoxy-amine, epoxy-phenolic and epoxy-comonomer reactions occur, resulting in the ultimate formation of a polymer network layer useful as a permanent dielectric.

A bilayer film in accordance with our invention was prepared as in Examples 1–5, below.

EXAMPLE 1

Preparation of Release Coat

Prior to casting the photosensitive and non-photosensitive layers of the permanent dielectric onto its backing material, the backing material was coated with a release material. The release material was prepared by first charging 72.4 kilograms of methanol and 18.1 kilograms of acetone into a 25 gallon polyethylene lined drum and stirring with an English mixer. 1.7 kilograms of Gantrez S95, available from ISP Technologies, Inc. of Farmingdale, N.J., was added to the solvent mixture and stirred until completely dissolved. 7.2 kilograms of Nalco 1057, a colloidal silica available from Nalco Chemical Company of Chicago, Illinois, was then slowly added while mixing for an additional 10 minutes. Finally, 0.60 kilograms of melamine was added while stirring for 15 minutes.

EXAMPLE 2

Preparation of Intermediate Solution 25 gallons of intermediate solution useful for formulating both photosensitive and non-photosensitive film layers was prepared in the following manner. A stainless steel kettle reactor fitted with an air driven stirrer was purged with nitrogen for four hours at approximately 50 standard cubic feet per hour. 53.9 kilograms of acetone was charged to the kettle. 23.0 kilograms of a phenolic novolac resin available as SD-7280 from Borden Chemical Company of Louisville, Kentucky was added through an addition port in the kettle. The foregoing mixture was stirred for 30 minutes at 50 to 80 rpm while maintaining a 10 standard cubic foot per minute nitrogen purge.

Immediately thereafter, 5.6 kilograms of Acroloid AT-70, a 50% solution of a film-forming thermoplastic acrylic copolymer available as from Rohm and Haas Company of Philadelphia, Pennsylvania, was added to the reactor through its addition port followed by a rinse of 0.5 kilograms of acetone. Stirring continued for 30 minutes at room temperature.

0.35 kilograms of the basic catalyst 2,4,6-tris [(dimethylamino)methylphenol] available as DMP 30 from Aldrich Chemical of Milwaukee, Wisconsin, was then added to the reactor and stirred for another 30 minutes.

Next, 1.6 kilograms of a polyaryl isocyanate resin available as Isonate 2143L from Dow Chemical Company of Midland, Michigan, was added to the reactor at the rate of 25 grams per minute. The reactor was stirred for one hour after Isonate addition was completed.

Finally, 1.1 kilograms of phenylisocyanate was added to the reactor, with the resulting mixture being stirred for one hour. The prepared mixture was filtered through a 10 micron bag filtration apparatus into a clean and dry drum for use in preparing photosensitive and nonphotosensitive layer solutions as described below.

The resulting intermediate solution contained, on a weight percent basis, 26.2% of the phenolic novolac resin, 6.3% of the acrylic copolymer, 0.4% of the basic catalyst, 1.8% of the polyaryl isocyanate, 1.3% phenylisocyanate, and 64% of the acetone solvent.

EXAMPLE 3

Preparation of Photosensitive Film Solution

The solution used to prepare a photosensitive layer in the dry film material in accordance with the invention was prepared as follows. 25.2 kilograms of acetone, 18.0 kilograms of methyl ethyl ketone, and 73.5 kilograms of the intermediate solution of Example 2 were charged into a clean, polyethylene lined drum and stirred with a high shear mixer. 7.35 kilograms of an epoxy resin available as DEN 431 from Shell Chemical Company of Houston, Tex., and 10.3 kilograms of bisphenol F glycidyl ether epoxy resin available as EPON 862 from Dow Chemical were then added to the drum and the solution mixed for an additional five minutes. 5.9 kilograms of bis-diazoquinone photosensitizer was added to the solution and mixed until dissolved. 3.4 kilograms of diaminodiphenyl sulfone available as DDS from Chriskev Company of Leawood, Ks. and 1.8 kilograms of phthalic anhydride (PA) were added to the solution and mixed until dissolved. Finally, 1.47 kilograms of melamine was added to the solution, with the solution thereafter being mixed for an additional 20 minutes. The solution was then stored in anticipation of casting a photosensitive film layer. It should be noted that this solution has a limited shelf life and should be used preferably within 24 hours of preparation.

EXAMPLE 4

Preparation of Non-Photosensitive Film Solution

The solution used to cast the nonphotosensitive layer of the dry film material was prepared as follows. 81.6 kilograms of the intermediate solution of Example 2, 23.4 kilograms of acetone, and 18 kilograms of methyl ethyl ketone were charged into a clean polyethylene lined drum and stirred. 8.18 kilograms of an epoxy resin available as DEN 431, and 11.4 kilograms EPON 862 from Dow Chemical were added to the drum and mixed for 5 minutes. 2.46 kilograms of DDS and 3.27 kilograms of phthalic anhydride were added to the drum and mixed until dissolved. 1.65 kilograms of melamine, available as Cymel 303 from Cytek Industries of Kalamazoo, Michigan, was then added to the drum and the solution mixed for an additional 30 minutes. The resulting solution was stored in anticipation of casting the film. It should be noted that this solution has a limited shelf life and should used preferably within 24 hours of preparation.

EXAMPLE 5

Preparation of Bilayered Film Product

The solutions described above were used to prepare a dry film in accordance with the present invention. The order the solutions were cast produces a film such that after laminating the film to a substrate the non-photosensitive layer is bonded to the substrate and the photosensitive layer is on the top surface. First, a continuous 265 gauge polyester 30 inches wide film was coated with 50–70 mg/sq. ft. of the release coat material. The release material was applied by transferring the polyester film at a constant rate and applying the release material coating using a gravure process. The release material was dried by transferring the coated web through a drying oven at a temperature of 225° F. at a line speed of 150 ft/min.

A 0.75 mil photosensitive (PS) layer was applied over the release material using a slotted die extrusion process. The photosensitive layer was applied at a line speed of 20–50 ft/min. The photosensitive layer was dried by passing the coated web again through a drying oven at a temperature of $\leq 275°$ F. and at a residence time of $\leq 120$ seconds.

Finally, a nonphotosensitive (NPS) layer approximately 0.75 mils thick was applied over the photosensitive layer in the same manner as the photosensitive layer. The nonphotosensitive layer was dried by passing the coated web through a drying oven at a temperature of $\leq 275°$ F. and at a residence time of $\leq 120$ seconds. The 30 inch wide web was slit into 12 inch wide rolls and stored for processing.

EXAMPLE 6

Exposure and Development of Dry Film Material

A 12 inch by 12 inch sample of the completed dry film material was laminated to an FR-4 substrate using a dry film roll laminator. The film was oriented such that the nonphotosensitive film layer was in contact with the substrate. The upper and lower laminator roller temperatures were 225 degrees Fahrenheit, the roller pressure was 25 psi, and the film/substrate was passed through the laminator at a rate of 1.5 feet per minute.

The laminated substrate (hereafter the "test plate") was allowed to cool for approximately 10 minutes, and the polyester film was removed from the laminate immediately thereafter.

Ugra and Stouffer masks were used to provide test images. These masks were placed over the test plate, and the test plate was then exposed to approximately 400 mJ/cm2 of actinic radiation. The exposed test plate was positioned vertically in an exhaust hood for spray development.

One liter of a concentrated aqueous, basic photoresist developer was diluted 4 parts water to 1 part concentrate (v/v) at room temperature. The pH of the diluted solution was approximately 13, and the temperature of the developer immediately before applying to the test plate was approximately 75 degrees Fahrenheit.

The test plate was developed by spraying the entire surface of the test plate from a spray bottle once every 15 seconds. Spraying direction was alternated between vertical and horizontal spraying motions. Spraying continued until the test plate was fully developed, as indicated by the presence of shiny copper in the exposed areas. The test plate was then rinsed with deionized water and blown dry with air.

The board exhibited a high degree of resolution of approximately 2 mils for vias and 1 mil for lines.

EXAMPLE 7

Plating of Developed Test Plate

A 2 inch by 4 inch test coupon was cut from the test plate of Example 6 for plating. The coupon was partially cured in an oven at 90 degrees Centigrade for one hour prior. The coupon was then oxidized in a dilute aqueous solution of McDermid M-Permanganate P (4 grams/liter NaOH and 5.5 to 6 grams/liter of potassium permanganate) without the use of any swelling agent for 5 minutes at 75 degrees Centigrade.

The test coupon was then cured in an oven by ramping the coupon at 5 degrees Centigrade per minute to a temperature of 176 degrees Centigrade. The coupon was maintained at that temperature for 30 minutes and allowed to cool.

The cured coupon was then subjected to conventional desmear and plating steps. The coupon was desmeared in a solution of McDermid M-Permanganate P (40 grams/liter NaOH and 55 to 60 grams/liter of potassium permanganate) for 5 minutes at 90 degrees Centigrade, plated using an electrolytic copper process as is well known in the art and allowed to set for 48 hours.

Adhesion of the copper to the thermoset substrate was measured by a 90 degree peel test. A one half inch wide strip of the test coupon was cut from the center of the coupon and placed in a Romulus 3 test device. The test device was set up to pull the plated copper layer perpendicularly away from the substrate at a rate of 2 inches per minute while measuring the adhesion of the copper to the substrate. Adhesion of the copper to the substrate averaged in the range of 6.2 to 6.3 pounds, with some test values exceeding 7.4 pounds.

While Example 5 described the production of a bilayered film by the sequential application of a photosensitive and nonphotosensitive film layer to a release coated carrier film, such a film can be produced by other means. For example, a nonphotosensitive layer could be coated on one carrier film, and a photosensitive layer coated on a second carrier film. The two films could then be laminated together by heat and/or pressure to produce a bilayered material. Such a process could provide advantages as the two layers could be dried separately prior to lamination, possibly enabling the production of thicker films and permitting the use of different chemistries in the two layers that might not be suitable in a sequential manufacturing process.

The processes described in Examples 6 and 7 can be used to produce built-up multilayer circuit boards having several alternating layers of circuit elements and dielectric areas. Typically, such boards will be prepared using a substrate such as an FR-4 board which already bears a printed wiring pattern on its surface. A layer of bilayer film of the type described above is then laminated to the substrate, imaged, and developed as in the previous Examples.

Electrical connections are formed between the circuit elements in adjacent layers where plating solution penetrates photovias in an upper layer to reach a circuit element on a lower layer. Such connections may be formed through multiple circuit layers where photovias in adjacent layers are located directly over one another.

The process described above can be repeated as many times as necessary to produce multilayer boards having extremely high densities of electrical connections per square centimeter.

Other methods for forming electrical interconnects between and within the electrical insulating layers of a printed wire board can be employed with photosensitive dry film materials in accordance with the invention. For example, electrically conductive layers can be formed by depositing conductive inks or pastes into vias and/or trenches formed in the photosensitive dry film material, and/or by laminating or applying a foil or layer of electrically conductive material to the to the photosensitive dry film material and then patterning the deposited conductive layer. Such processes may reduce the cost to fabricate build-up multilayer printed wire boards relative to use of plating processes.

Preferred dry film embodiments of the invention can be identified by their ability to pass a "mandrel test" or a "crease test." The mandril test measures the ability of a dried film material to flex over a mandrel of a specified diameter without cracking, and as used herein, a film that passes the mandrel test is "pliable." The crease test measures the tendency of a dried film material to flake, and a film passing the crease test is said to "non-flaking." Both tests are described in detail below.

The mandrel test method determines of the flexibility of a dry film bonded to a Mylar substrate and is similar to ASTM Procedure D 433840 "Flexibility Determination of Supported Adhesive Films by Mandrel test Test Method" and ASTM Procedure D 522–93A "Mandrel test Test of Attached Organic Coatings."

The mandrel test is performed by coating a Mylar test substrate with a particular dry film composition. A properly sized and conditioned piece of film then is bent over a rod-shaped mandrel at a temperature of 180° C. with the dry film side away from the mandrel to perform a tension mode test, and with the dry film side closest to the mandrel for a compression mode test. The test is performed using a fresh specimen for each set of tests (tension or compression), and is performed with progressively smaller diameter mandrels until the dry film fails (cracks) on bending. The "flexibility value" of dry film is the smallest diameter mandrel over which the test specimen does not fail.

Specifically, the test apparatus consists of a series mandrels supported at each end and having diameters of $\frac{1}{8}$", $\frac{3}{16}$", $\frac{1}{4}$", $\frac{5}{16}$", $\frac{3}{8}$", $\frac{7}{16}$", $\frac{1}{2}$", $\frac{3}{4}$", 1". Suitable mandrels are available from BYK-Gardner USA, 310-483-6500, Catalog number MG-1412.

Test panels for supporting the dry film are made from Mylar having a thickness ranging from 0.5 mil to 2.0 mil. The dimensions of a coated test panel are approximately 2.75" in width by 4" in length. The width dimension is not critical except that it should not be so wide as to not fit the test mandrel or so wide that it could not be bent uniformly over the test mandrel through an angle of 180° (into a U-shape) using only the thumb and forefinger of one hand. Test panels should be free of dust and contamination.

The test samples are prepared as follows. A doctor blade is used to cast a uniform dry film at least 6 inches wide and of the thickness desired to the clean side of the Mylar test support. If a suitable doctor blade is not used or available, other mutually acceptable coating procedures such as dip, flow and spray can be used as long a uniform coating results meeting the required thickness. The coated film is then cured. Suitable test panels will have no flaws in the coating visible to the naked eye. Thickness of the dry film is then measured to within 0.1 mils.

The test panels are conditioned prior to the test by storing the test specimens and test apparatus at the desired test conditions for 24 hours. Perform the test under these same conditions. Unless otherwise noted herein, the storage and test conditions are be 23±20° C. and 50±5% relative humidity.

The test is performed in the same environment used to condition the test panels and test apparatus. The largest diameter mandrel is placed in a horizontal operating position in a test frame. The test panel is grasped between the thumb and forefinger of one or both hands, with the longest dimension between the fingers. Tension mode measurements are made by laying the Mylar side of the test panel tangentially at right angles to the longitudinal axis of the mandrel. Compression mode measurements are made by laying the dry film side of the test panel tangentially at right angles to the longitudinal axis of the mandrel. Within 1 second, the test panel is bent 180° around the mandrel to form an inverted U-shape over the mandrel while maintaining contact between the with the mandrel.

The test panel has failed the test fracture, crazing, or cracking of the dry film is visible to the naked eye. This can occur at any time during the bending of the dry film test specimen over the mandrel. Color changes or blushing not affecting the tensile properties of the materials, are not considered as failure. If no failure has occurred, the test panel is folded over the next smaller diameter mandrel and the test is repeated. Successively smaller mandrels can be used until failure of a test panel is observed. The % strain value of the dry film can be calculated by the following equation:

% strain=100%×[(substrate+film thickness)/(substrate thickness)]/flexibiltiy value/2

The following tables contain estimated % strain values for various dry film and Mylar support thicknesses.

TABLE 1

Mylar Support Thickness = 2.6 mils

| Mandrel Diameter | | Dry Film Thickness | | | | |
|---|---|---|---|---|---|---|
| Inches | mils | 0.50 | 0.75 | 1.00 | 1.50 | 2.00 |
| 1 | 1000 | 0.310% | 0.335% | 0.360% | 0.410% | 0.460% |
| ¾ | 750 | 0.413% | 0.447% | 0.480% | 0.547% | 0.613% |
| ½ | 500 | 0.620% | 0.670% | 0.720% | 0.820% | 0.920% |
| 7/16 | 438 | 0.708% | 0.765% | 0.822% | 0.936% | 1.050% |
| ⅜ | 375 | 0.827% | 0.893% | 0.960% | 1.093% | 1.227% |
| 5/16 | 313 | 0.990% | 1.070% | 1.150% | 1.310% | 1.470% |
| ¼ | 250 | 1.24% | 1.340% | 1.440% | 1.640% | 1.840% |
| 3/16 | 188 | 1.649% | 1.782% | 1.915% | 2.181% | 2.447% |
| ⅛ | 125 | 2.480% | 2.680% | 2.880% | 3.280% | 3.680% |

TABLE 2

Mylar Support Thickness = 1.5 mils

| Mandrel Diameter | | Dry Film Thickness | | | | |
|---|---|---|---|---|---|---|
| Inches | mils | 0.50 | 0.75 | 1.00 | 1.50 | 2.00 |
| 1 | 1000 | 0.220 | 0.225% | 0.250% | 0.300% | 0.350% |
| ¾ | 750 | 0.267 | 0.300% | 0.333% | 0.400% | 0.467% |
| ½ | 500 | 0.400 | 0.450% | 0.500% | 0.600% | 0.700% |
| 7/16 | 438 | 0.457 | 0.514% | 0.571% | 0.685% | 0.799% |
| ⅜ | 375 | 0.533 | 0.600% | 0.667% | 0.800% | 0.933% |
| 5/16 | 313 | 0.639 | 0.719% | 0.799% | 0.958% | 1.118% |
| ¼ | 250 | 0.800 | 0.900% | 1.000% | 1.200% | 1.400% |
| 3/16 | 188 | 1.064 | 1.197% | 1.330% | 1.596% | 1.862% |
| ⅛ | 125 | 1.600 | 1.800% | 2.000% | 2.400% | 2.800% |

Films tested in this manner are said to be "pliable" at a given mandrel diameter if the dry film material can be tested over the mandrel without any observed cracking of the dry film coating.

The crease test is performed in the following manner. A 1.5 by 9 inch coated sample is cut from a coated sheet with a paper cutter whose blade is oriented parallel to the direction of coating on the sheet. The strip is placed coating side up on a flat surface, and then folded so that the two coated ends are in contact with each other. The folded sheet is rolled from the ends to the folded middle section with a 4.5 pound rubber coated roller, taking care not to apply pressure above that supplied by the roller's weight. The rolled film is unfolded. One end of the film is then folded toward the middle so that the end contacts the crease in the middle of the film formed by the action of the roller, forming a loop. The sample is then rolled along the 1.5 inch width to make a second crease.

The rolled sample is unfolded and carefully examined for evidence of flaking or delamination. If none is noted, the sample has passed the crease test, and the film is said to be "non-flaking."

We have found that high performance films capable of passing both the crease and mandrel tests described above can be produced by modifying the dry film coatings already described to improve the resiliency of the cured dry film material. Improved performance can be obtained by employing a stress-modified phenolic resin as a component of the film-forming adduct, by adding a reactive liquid polymer to the formulation, by including a high molecular weight rubber in the formulation, or by controlling the epoxy to novolac ratio and epoxy resin content of certain formulations.

Stress-Modified Phenolic Resins

The film-forming properties of many conventional phenolic resins are not ideal. Phenolic resins in general, and novolac resins in particular, are amphilytic materials. These resins contain hydrophilic regions imbedded in their hydrocarbon backbone. These hydrophilic regions form intramolecular hydrogen bonds, and are the source of the hyperacidity observed in novolacs. As a consequence of this intramolecular hydrogen bonding, novolacs do not exhibit ideal film-forming properties. Films formed from phenolic novolacs can crack, flake, and generate dust. This behavior also is characteristic of dry films formulated from these novolacs. For this reason, the screening process described in Example 8, below, was developed to determine whether certain phenolic novolac resins might exhibit improved film forming abilities that would provide for a high performance dry film material.

EXAMPLE 8

The film forming characteristics of several classes of phenolic resins were evaluated by the following procedure. The selected phenolic resin (30 parts) was dissolved in a casting solvent (70 parts) selected from the following list.

| Casting Solvent | Boiling Temperature ° C. |
|---|---|
| Methylethylketone | 80 |
| Methylisobutylketone | 118 |
| Ethylethoxypropionate | 165 |
| Ethyl lactate | 154 |
| Propylene glycol methyl ether acetate | 146 |

The coating solutions were drawn down into a film on a sheet of polyester film pretreated with a release coating as described in Example 5. The films were cast using a wire-wound #40 Mayer rod. The cast material was oven-dried for 2 minutes at 120° C. The dried films were evaluated for visual appearance and tested by the mandrel and crease tests previously described. Several classes of phenolic resins were screened by this procedure. The films formed from ethyl ethoxypropionate were noticeably inferior to the films cast from the other solvents or combinations of the other solvents.

These characteristics appear to be largely independent of carrier solvent and the particulars of film preparation. The film forming characteristics of several phenolic resins are summarized in Table 3, below.

TABLE 3

| Resin | Supplier | Description | Film Forming Characteristics | Film Description | Strain Resistance |
|---|---|---|---|---|---|
| SD-1794 (SD-7280) | Borden | Phenol Novolac Mn = 900 | below average | transparent brittle | <0.5% |

TABLE 3-continued

| Resin | Supplier | Description | Film Forming Characteristics | Film Description | Strain Resistance |
|---|---|---|---|---|---|
| SD-193A | Borden | Cresol Novolac 50/50-m/p, Mn = 850 | slightly better than SD-1794 | transparent brittle | <0.5% |
| SD-326 | Borden | DCPD-phenol | average | transparent brittle | <0.5% |
| SD-300A | Borden | DCPD-para-cresol | average | transparent brittle | <0.5% |
| SD-179A | Borden | DCPD-meta-cresol | average | transparent brittle | <0.5% |
| MILEX XL-225 | Mitsui Toatsu | xylylene phenol novolac | below average | transparent brittle | <0.5% |
| SD-788A | Borden | Siloxane-modified phenolic novolac | best of those evaluated | clear, pliable | >2.0% |
| Meiwa A | Meiwa | MBS-modified phenol novolac | average | hazy, pliable | ~1.0% |
| Meiwa B | Meiwa | MBS-modified xylylene phenol novolac | average | hazy, pliable | ~1.0% |
| Meiwa C | Meiwa | MBS-modified biphenyl phenol novolac | average | hazy, pliable | ~1.0% |
| Blend A | | 1/1 (w/w) mixture of SD1794/SD-788A | average | brittle | |
| Blend B | | 1/2 (w/w) SD1794/SD-788A | average | brittle | |
| Blend C | | 1/2 (w/w) SD-1794/SD-788A | average | brittle | |

The Meiwa A resin in Table 3 is 15 weight percent EXL 2655, a MBS core-shell elastomer available from Rohm and Haas in a phenolic novolac DL92, Meiwa B also is 15 weight percent EXL 2655 in a phenol-paraxylylene copolymer (MEH 7800 SS from Meiwa), and Meiwa C is 15 weight percent 2655 in dimethylbiphenylphenol (MEH 7857 also available from Meiwa.

As can be seen from the data in Table 3, only the stress-modified phenolic resins (SD788A and Meiwa A, B and C) were capable of forming non-brittle films. As used in this application, the term "stress modified phenolic resin" means a phenolic resin including an elastomer, rubber or thermoplastic having a lower room temperature modulus than the epoxy network which is intended to be chemically bound to the phenolic resin. Preferred stress modified resins include phenolic resins premixed with olefinic elastomers such as Kraton G available from Shell Chemical of Houston, Tex., epoxy styrene thermoplastic elastomers available under the tradename BONDFAST from Diacel of Tokyo, Japan, ethylene propylene diene monomer elastomers, polydimethylsiloxanes, especially functionally terminated versions thereof such as SILAPLANE available from Chisso Corp. of Japan, acrylic elastomers such as Acryloid EXL 2655, a core-shell metacrylate/butadiene/styrene eleastomer available from Rohm and Haas Company of Philidelphia, Pa., and the like.

It should be noted that casting solvent selection and addition of photoactive compound to the casting solution did not alter the brittle nature of the films characterized in Table1 3.

The utility of stress-modified phenolic resins in dry film and coating formulations is limited by their base solubility. Example 9, below, provides a method for screening the base solubilities of selected phenolic resins and modified resins.

EXAMPLE 9

A 40 weight percent solution of the selected phenolic resin in ethyl lactate was prepared. The solution was applied to a preweighed, three inch silicon test wafer using a Brewer/CEE spin-coater. The spincoated wafer was dried for 2 minutes at 115° C. on a Brewer/CEE Model 1100 substrate hot plate. Spin speed and spin time were varied to determine spin conditions yielding a nominal thickness, after drying, of 1 mil. Typically, spin speeds between 200 and 500 rpm and spin times of 15 to 20 seconds were employed.

After drying, each wafer was reweighed to determine coating weight. Coating thickness was determined using an AlphaStep 200 Profilometer. Film thickness determination was carried out by using a sharp single edge razor to score a line scratch through the film to the wafer surface. The profilometer stylus was run across the scratch at several points along the scratch, and the thickness recorded. A total of eight wafers were coated with each phenolic resin. A coated wafer from each set was mounted in a HDPE wafer holder and the holder placed in 1 liter of 0.35N sodium hydroxide solution.

Dissolution was determined by wafer color as phenolate ions are highly colored. The surface of a wafer turns a reddish-brown when exposed to aqueous sodium hydroxide. The coating is determined to be dissolved when the wafer appears bright silver in color. The time interval between immersion and dissolution was recorded and averaged with the other test wafers in each set. The results of the test are summarized in Table 4, below.

TABLE 4

| Phenolic Resin | Apparent Density mg/µm | Dissolution Rates | | |
|---|---|---|---|---|
| | | µm/sec | mg/sec | meq/sec |
| SD-1794 | 8.42 | 0.168 | 1.42 | 0.0139 |
| SD-193A | 5.75 | 0.285 | 1.62 | 0.0135 |
| SD-788A | 8.14 | 0.185 | 1.45 | 0.0081 |
| Meiwa A | 6.51 | 0.371 | 2.33 | 0.0192 |
| Meiwa B | 4.90 | wafer separated | — | — |
| Meiwa C | 4.86 | wafer separated | — | — |

A resin is said to be "base-soluble" using the foregoing test if it exhibits a dissolution rate less than about 0.02 mg/sec. Resins having higher dissolution rates or which lose adhesion to the substrate before dissolving are not considered to be base-soluble, and are not preferred for use in formulations of the invention.

Example 11, below, illustrates the use of stress-modified phenolic resins in accordance with our invention.

EXAMPLE 11

In this example, the good film-forming characteristics of stress-modified phenolic resins, such as SD-788A, eliminate the need for the film-forming adduct and the film-forming thermoplastic from formulations in accordance with our invention. Photosensitive films were cast from a methyl isobutyl ketone/ethyl lactate solve mixture, as already described above.

Coating solutions were prepared having the part by weight compositions set forth in Table 5, below. For example, a coating solution comprising 21.55g SD-788A was dissolved in 25g of ethyl lactate. Once the phenolic dissolved, the following components were added: the photoactive compound bis-(2-diazonaphtho-1-quinone-5-sulfonate)-2,4-dihydroxybenzoquinone (DNQ) (3.25g), Epon 862 (21.9g), phthalic anhydride (PA) (2.30g), and DMP-30 (1.00g). The non-volatile material content was then adjusted to about 40 weight percent with methyl isobutyl ketone (MIBK), (25g).

The coating solution were drawn down into a film on a sheet of polyester film which had been pretreated with a release coating. The preparation of this release coated film is described in Example 5, above. The casting was accomplished using a wire-wound #40 Mayer rod. The coatings were oven-dried for two minutes at 120° C.

TABLE 5

| Sample | N2 | N3 | N4 | N5 | N6 | N7 | N8 | N9 |
|---|---|---|---|---|---|---|---|---|
| SD-788A | 21.55 | | 20.75 | | | | 21.35 | 19.35 |
| Meiwa B | | 22.95 | | 22.1 | | | | |
| Meiwa C | | | | | 22.1 | 21.45 | | |
| ethyl lactate | 25 | 25 | 25 | 25 | 25 | 25 | 25 | 25 |
| DNQ | 3.25 | 3.45 | 3.1 | 3.3 | 3.3 | 3.2 | 3.2 | 2.9 |
| Epon 862 | 21.9 | 20.5 | 21.1 | 19.75 | | | | |
| Epon SU-8 | | | | | 21.8 | 21.15 | | 24.7 |
| DEN 431 | | | | | | | 22.2 | |
| PA | 2.3 | 2.15 | | | 1.85 | | 2.3 | 2.05 |
| DDSA[1] | | | 4.1 | 4.1 | | 3.25 | | |
| MIBK | 25 | 25 | 25 | 25 | 25 | 25 | 25 | 25 |
| DMP-30 | | 1.0 | 1.0 | 1.0 | 1.0 | 0.9 | 1.0 | 1.0 |
| Crease Test | pass | pass | pass | fail | fail | fail | pass | fail |

[1]DDSA = dodecylsuccinic anhydride (Lonza)

The films of samples N2 through N4 and N8 were pliable, but they were initially tacky and solidified only slowly upon standing. The initial tackiness appears to be the result from slow solidification rather than high residual solvent. To address the tackiness a high Tg epoxy resin, based on a bisphenol A novolac, Epon SU-8, available from Shell Chemical, was used in combination with Epon 8281, a bisphenol A diglycidyl ether also available from Shell Chemical, in an attempt to improve solidification. These results are summarized in samples N10 through N13. The solution preparation and film casting is the same as samples N2 through N9 above, except the order of addition was changed to minimize air entrapment. The components are listed in order of addition in Table 6, below. The exposure dose was 400 mJ/cm$^2$.

TABLE 6

| Sample | N10 | N11 | N12 | N13 |
|---|---|---|---|---|
| SD-788A | 12 parts | 11.8 | 11.6 | 11.4 |
| ethyl lactate | 30 | 30 | 30 | 30 |
| DMP-30 | 0.6 | 0.6 | 0.6 | 0.6 |
| DNQ | 1.80 | 1.77 | 1.74 | 1.71 |
| Epon 8281 | 6.7 | 3.3 | 6.45 | 3.18 |
| Epon SU-8 | 7.6 | 11.3 | 7.38 | 10.9 |
| PA | 1.3 | 1.26 | | |
| DDSA | | | 2.28 | 2.25 |
| Crease test | fail | fail | pass | fail |
| Mandrel test % max strain | 0.4 | 0.4 | 0.7 | 0.4 |
| Day 0 room temperature development time in minutes | 5.00 | 4.00 | 8.00 | 6.50 |

As can be seen from the foregoing samples, raising the softening point of a dry film by adding a solid epoxy resin such as Epon SU-8 reduces the pliability of the film. Higher molecular weight epoxy phenol novolac resins were therefore evaluated. These resins DEN 438 and DEN 439, available from Dow Chemical, are higher molecular weight homologs of DEN 431 used in sample N8. Coating solutions were prepared as above except the order of addition is as listed. The casting was accomplished using a wire-wound #40 Mayer rod. The coatings were oven-dried for two minutes at 120° C. Exposure and development are as described above. As can be seen from the data in Table 7, all samples passed the crease test, and those containing DEN 439 (the higher molecular weight homolog) displayed high stress resistance.

TABLE 7

| Sample | N14 | N15 | N16 | N17 |
|---|---|---|---|---|
| SD-788A | 12.7 parts | 11.9 | 12.2 | 11.5 |
| ethyl lactate | 30 | 30 | 30 | 30 |
| DMP-30 | 0.6 | 0.6 | 0.6 | 0.6 |
| DEN 438 | 13.4 | | 12.9 | |
| DEN 439 | | 14.5 | | 14.0 |
| PAC | 1.92 | 1.8 | 1.8 | 1.7 |
| PA | 1.35 | 1.26 | | |
| DDSA | | | 2.4 | 2.25 |
| Crease test | pass | pass | pass | pass |
| Mandrel test % max strain | 0.8 | 2.9 | .8 | 1.4 |
| Day 0 room temperature development time, min | 2.00 | 1.00 | 3.50 | 1.75 |

In the following samples N18 through 20, the influence of photoactive compound level (DNQ) on dry film performance was evaluated. Solution preparation, film casting, and film evaluation were performed as before. Samples results are summarized in Table 8, below.

TABLE 8

| Sample | N18 | N19 | N20 |
|---|---|---|---|
| SD-788A | 20.1 | 19.3 | 18.55 |
| ethyl lactate | 50 | 50 | 50 |
| DMP-30 | 1.0 | 1.0 | 1.0 |
| DNQ | 2.00 | 3.85 | 5.55 |
| Epon 8281 | 5.6 | 5.35 | 5.15 |
| Epon SU-8 | 19.2 | 18.45 | 17.75 |
| PA | 2.15 | 2.05 | 2.0 |
| Crease test | pass | pass | fail |
| Mandrel test % max strain | 0.5 | 0.4 | 0.4 |
| Day 0 room temperature development time, Samples at exposed at 400 mJ/cm$^2$ min | 4.25 | 7.50 | 12.0 |

Samples N18 through N20 show that except at extremely high loadings of photoactive compound, DNQ level did not affect film handling characteristics. Increasing the photoactive compound concentration without increasing the exposure dose leads to an increase in development time, but small lines and vias did not open at the 400 mJ/cm$^2$ exposure level. When the exposure was increased to 800 mJ/cm$^2$ the results in Table 9 were obtained.

TABLE 9

| Sample | N18 | N19 | N20 |
|---|---|---|---|
| Day 0 room temperature development time in | 6.0 | 9.50 | 13.0 |

TABLE 9-continued

| Sample | N18 | N19 | N20 |
|---|---|---|---|
| minutes, samples exposed at 800 mJ/cm$^2$ | | | |
| Smallest via open, diameter mils | 15 | 10 | 12 |

The effect of stoichiometry of the epoxy network is shown by samples N21 through N27 and is summarized in Table 10. In examples N26 and N27, addition of a phenolic novolac to increase resolution was screened. The solutions were prepared, cast, and dried as above. Methyl isobutyl ketone was used as a cosolvent. Solution preparation, film casting, and film evaluation were performed as before.

TABLE 10

| Samples | N21 | N22 | N23 | N24 | N25 | N26 | N27 |
|---|---|---|---|---|---|---|---|
| SD-788A | 22.75 parts | 19.70 | 17.35 | 21.1 | 14.75 | 13.4 | 8.15 |
| SD-7280 | | | | | | 4.45 | 8.15 |
| ethyl lactate | 25 | 25 | 25 | 25 | 25 | 25 | 25 |
| DNQ | 3.4 | 2.95 | 2.6 | .15 | 2.2 | 2.7 | 2.45 |
| Epon 8281 | 4.75 | 5.5 | 6.05 | 5.3 | 6.15 | 5.9 | 6.3 |
| Epon SU-8 | 16.3 | 18.8 | 20.7 | 18.15 | 21.15 | 20.3 | 21.55 |
| PA | 1.8 | 2.1 | 2.3 | 1.35 | 4.7 | 2.25 | 2.5 |
| DMP-30 | 1.0 | 1.0 | 1.0 | 1.0 | 1.0 | 1.0 | 1.0 |
| MIBK | 25 | 25 | 25 | 25 | 25 | 25 | 25 |
| Crease test | pass | pass | fail | pass | marginal pass | pass | fail |
| Mandrel test % max strain | n/a | n/a | n/a | n/a | n/a | n/a | n/a |
| Day 0 room temperature development time, minutes | 3.0 | 9.0 | >10 | 6.5 | 10 | 7.0 | 8.5 |
| Via resolution, mils | 10 | 10 | >20 | >20 | 14 | 8 | 14 |
| Contrast, Stouffer step | — | 3 | 3 | 7 | 8 | 4 | 2 |

The variations in stoichiometry appear to affect contrast as measured by a reduced Stouffer step for samples N26 and N27, with no reproducible trend in resolution being noted.

Samples N28 through N32 demonstrate the influence of siloxane level and epoxy network stoichiometry on dry film performance. Borden SD-788A, contains about 20 weight percent epoxy, the siloxane content of the dry films was estimated on this basis. Solution preparation, film casting, and film evaluation were performed as before. These results are summarized in Table 11, below.

TABLE 11

| Samples | N28 | N29 | N30 | N31 | N32 |
|---|---|---|---|---|---|
| SD-788A | 14.45 | 15.5 | 11.95 | 11.0 | 13.4 |
| SD-7280 | 4.8 | 5.15 | 4.0 | 3.65 | 4.45 |
| ethyl lactate | 25 | 25 | 25 | 25 | 25 |
| DNQ | 2.9 | 3.1 | 2.4 | 2.2 | 2.7 |

TABLE 11-continued

| Samples | N28 | N29 | N30 | N31 | N32 |
|---|---|---|---|---|---|
| Epon 8281 | 5.6 | 5.4 | 6.55 | 6.7 | 5.9 |
| Epon SU-8 | 19.15 | 18.5 | 22.45 | 22.95 | 20.3 |
| PA | 2.15 | 1.4 | 1.65 | 2.55 | 2.25 |
| DMP-30 | 1.0 | 1.0 | 1.0 | 1.0 | 1.0 |
| MIBK | 25 | 25 | 25 | 25 | 25 |
| Estimated siloxane content, wt % (dry basis) | 5.8 | 6.2 | 4.8 | 4.4 | 5.4 |
| Crease test | pass | pass | fail | fail | fail |
| Mandrel test % max strain | <0.4 | <0.4 | <0.4 | <0.4 | <04 |
| Day 0 room temperature development time, minutes | 10.0 | 8.5 | 7.5 | 7.5 | 9.0 |
| Via resolution, mils | 5 | 12 | 17 | 14 | 6 |
| Contrast, Stouffer step | 4 | 3 | 3 | 5 | 4 |

Samples N28 through N32 show that about 6 weight percent polysiloxane (dry basis) is required to pass the crease test, but this level of polysiloxane does not improves strain resistance. At the levels tested, addition of phenolic novolac seems to have little influence on via resolution.

Samples N34 and N35 were run to show the effect of using other types of high Tg resins in dry film materials in accordance with our invention. Epon SU-8 was selected as the principal epoxy resins in these systems because it is known to impart high glass transition temperatures to novolac hardened epoxy networks. The so-called multifunctional epoxies are also capable of raising the Tg relative to other epoxy resins such as diglycidyl ethers epoxyphenol novolacs and epoxy-ortho-cresol novolacs. One of these multifunctional epoxy resins, EPPN-502H (available from Nippon Kayaku Co., Ltd., Tokyo), was used instead of Epon SU-8 or SU-8/Epon 8281 blends. Solution preparation, film casting, and film evaluation were performed as before, with results summarized in Table 12, below.

TABLE 12

| Sample | N34 | N35 |
|---|---|---|
| SD-788A | 21.75 parts | 20.95 |
| MIBK | 25 | 25 |
| ethyl lactate | 25 | 25 |
| EPPN-502H | 21.65 | 20.85 |
| DMP-30 | 1.0 | 1.0 |
| DNQ | 3.25 | 3.15 |
| PA | 2.3 | |
| DDSA | | 4.1 |
| Crease test | pass | pass |
| Mandrel test % max strain | <0.4 | 0.4 |
| Day 0 room temperature development time, minutes | 3.25 | 10.75 |
| Via resolution, mils | 17 | 4 |

This substitution did not substantially alter the balance of dry film properties.

Taken together, samples N2 through N35 demonstrate the utility of stress-modified novolac resins in imparting pliability and low brittleness to dry film materials. Repeated successes in passing the crease and mandrel tests in these samples suggest that the preferred epoxy to novolac ratio when using stress-modified novolacs is from about 0.75 to 1.10, with the range from 0.85 to 1.05 being most preferred.

Formulations Using Reactive Liquid Polymers

Improved film formulations in accordance with our invention can be prepared using reactive liquid polymers. As used in this application, the term "reactive liquid polymer" means a synthetic elastomer containing reactive functional groups on both terminal positions of the polymer chain. Reactive liquid polymers include, for example, acrylonitrile butadiene copolymers terminated by amine, epoxy, carboxy groups, as well as hydroxy-terminated polybutadienes and amine- or epoxy-terminated polydimethyl siloxanes. Preferably the reactive liquid polymer is incorporated into the intermediate solution used for preparing the formulation to be cast as described in Examples 10 and K–N, below.

EXAMPLE 10

An intermediate solution C was prepared in the following manner. 2,100 grams of Hycar® 1300X16 and 3,691 grams of gamma-butyrolactone (GBL) were charged to a polypropylene container and mixed overnight. Hycar 1300X16 is an amine-terminated acrylonitrile butadiene copolymer available from B. F. Goodrich Co. of Cleveland, Ohio. A separate solution of 7.8 kg of SD-7280 and 15.81 kg of GBL was prepared in a 10 gallon stainless steel tank, with mixing. After the SD-7280 had dissolved, 570 grams of 4,4'-methylenebis(phenylisocyanate) (MDI) was added and mixed for an hour. The Hycar solution was then added to the SD-7280/MDI solution and mixed for an hour, followed by the addition of 30.8 grams of DMP-30 catalyst.

Photosensitive film solutions were then prepared from intermediate solution C as set forth below in Examples K–N, to illustrate that the use of a thermoplastic adduct comprising a copolymer of the phenolic resin with a reactive liquid polymer, comprising an acrylonitrile butadiene copolymer, can form a film having improved flexibility.

Examples K–N

Solutions used to cast a one mil photosensitive layer of the dry film material having the compositions set forth in Table, 13, below, were prepared using the following order of addition. The intermediate solution C and make-up solvent were charged into a clean, polyethylene-lined drum and stirred. To this solution was added the acrylic resin AT-147. Next the epoxy resins DEN 431 and optionally EPON 862 were added and the solution mixed for an additional five minutes. The bis-diazoquinone photosensitizer was added to the solution and mixed until dissolved. Next, the epoxy curing agents DDS and phthalic anhydride (PA) were added to the solution and mixed until dissolved. Finally, Cymel 303 was added to the solution, with the solution thereafter being mixed for an additional 20 minutes. The solution was then stored in anticipation of casting a photosensitive film layer. It should be noted that this solution has a limited shelf life and should be used preferably within 24 hours of preparation.

TABLE 13

| Example: | K | L | M | N |
|---|---|---|---|---|
| intermediate C | 50.0 g | 50.0 g | 40.0 g | 40.0 g |
| MEK | 25.3 g | 34.7 g | 24.9 g | 20.7 g |
| AT-147 | 3.2 g | 2.6 g | 0 | 0 |
| DEN 431 | 5.0 g | 19.2 g | 17.2 g | 14.4 g |
| EPON 862 | 7.0 g | 0 | 0 | 0 |
| PAC | 4.0 g | 3.2 g | 3.2 g | 3.2 g |
| PA | 1.2 g | 3.8 g | 1.9 g | 1.9 g |
| DDS | 2.3 g | 0 | 0 | 0 |
| Cymel 303 | 1.0 g | 0.8 g | 0.8 g | 0.8 g |

Crease and mandrel test results from films cast from the solutions of Examples K–P are set out in Table 14, below. The ratio of functional equivalents of epoxy to novolac and the weight percent epoxy contained in the dry weight of the film are also shown for comparison.

TABLE 14

|  | Epoxy/Novolac | Weight % Epoxy | Crease Test | Mandrel Test |
|---|---|---|---|---|
| Example K | 0.27 | 30% | Fail | 0.4% |
| Example L | 1.02 | 46% | Pass | 1.9% |
| Example M | 1.02 | 51% | Pass | 2.9% |
| Example N | 0.83 | 46% | Pass | 0.8% |

As can be seen by comparing Examples K–N, pliable, non-flaking films can be manufactured from formulations containing at least about 45% epoxy (based on dry film weight) and having an epoxy to novolac ratio of 0.8 or more.

Stress-modified film formulations in accordance with our invention also can be prepared by adding reactive liquid polymers to the formulation without first incorporating those polymers in the film-forming adduct. Representative formulations are described in Examples 11 and O–P, below.

EXAMPLE 11

An intermediate solution B was prepared by charging 105.6 grams of SD-7280 phenolic resin and 167 grams of GBL into an HDPE bottle, with mixing. After the SD-7280 had dissolved, 1.6 grams of DMP-30 catalyst was added with mixing. To this solution was added a slurry of 3.9 grams of MDI in 67 grams of GBL, and mixing was continued for two hours.

EXAMPLE O–P

Examples O and P illustrate that a reactive liquid polymer which is not copolymerized with the phenolic resin can also form films having improved flexibility. The solutions used to cast a one mil photosensitive layer of the dry film material having the compositions set out in Table 15 were prepared using the following order of addition. Intermediate solution B and make-up solvent were charged into a clean, polyethylene lined drum and stirred. To this solution was added the acrylic resin AT-147. Next the epoxy resins DEN 431 and optionally EPON 862 were added and the solution mixed for an additional five minutes. The bis-diazoquinone photosensitizer was added to the solution and mixed until dissolved. Next, the epoxy curing agents DDS and phthalic anhydride were added to the solution and mixed until dissolved. Cymel 303 was added to the solution. Finally, Epon 58005 was added with the solution thereafter being mixed for an additional 20 minutes. Epon 58005 is an epoxy-terminated acrylonitrile butadiene copolymer available from Shell, Houston, Tex. The solution was then stored in anticipation of casting a photosensitive film layer. It should be noted that this solution has a limited shelf life and should be used preferably within 24 hours of preparation.

TABLE 15

| Example: | O | P |
|---|---|---|
| intermediate B | 50.0 g | 40.0 g |
| MEK | 21.7 | 34.7 g |
| AT-147 | 3.2 g | 2.6 g |
| DEN 431 | 5.0 g | 19.2 g |
| EPON 862 | 7.0 g | 0 |
| PAC | 4.0 g | 3.2 g |
| PA | 1.2 g | 3.8 g |
| DDS | 2.3 g | 0 |

TABLE 15-continued

| Example: | O | P |
|---|---|---|
| Cymel 303 | 1.0 g | 0.8 g |
| Epon 58005 | 3.6 g | 3.9 g |

Table 16 summarizes crease and mandrel test results for films cast for the solutions of Examples O–P. The ratio of functional equivalents of epoxy to novolac and the weight percent epoxy contained in the dry weight of the film are also shown for comparison.

TABLE 16

|  | Epoxy/Novolac | Weight % Epoxy | Crease Test | Mandrel Test |
|---|---|---|---|---|
| Example O | 0.26 | 30% | Fail | <0.4% |
| Example P | 1.00 | 44% | Pass | 2.9% |

Examples O and P show that flexible dry films can be produced using non-copolymerized reactive liquid polymers where the epoxy to novolac ratio is about 1.

Improved Formulations Using Controlled Amounts of Epoxy and Epoxy Curing Agent and Specific Epoxy to Novolac Ratios Examples E–J below illustrate that the proper combination of epoxy level and epoxy curing agent also can form a film having improved flexibility. Solutions used to cast a one mil photosensitive layer of the dry film material having the composition set forth in Table 17 below, were prepared using the following order of addition. The intermediate solution B and make-up solvent were charged into a clean, polyethylene lined drum and stirred. To this solution was added the acrylic resin AT-147. Next the epoxy resin DEN 431 was added and the solution mixed for an additional five minutes. The bis-diazoquinone photosensitizer was added to the solution and mixed until dissolved. Next, the epoxy curing agents DDS and phthalic anhydride were added to the solution and mixed until dissolved. Finally, Cymel 303 was added to the solution, with the solution thereafter being mixed for an additional 20 minutes. The solution was then stored in anticipation of casting a photosensitive film layer. It should be noted that this solution has a limited shelf life and should be used preferably within 24 hours of preparation.

TABLE 17

| Example: | E | F | G | H | I | J |
|---|---|---|---|---|---|---|
| intermediate B | 25.0 g | 25.0 g | 25.0 g | 25.0 g | 25.0 g | 25.0 g |
| MEK | 0 | 0 | 6.8 g | 9.1 g | 5.5 g | 1.4 g |
| AT-147 | 1.6 g | 1.6 g | 1.6 g | 1.6 g | 1.6 g | 1.6 g |
| DEN 431 | 6.0 g | 6.0 g | 12.0 g | 12.0 g | 12.0 g | 9.2 g |
| PAC | 2.0 g | 2.0 g | 2.0 g | 2.0 g | 2.0 g | 2.0 g |
| PA | 1.2 g | 0 | 2.4 g | 0 | 0 | 0 |
| DDS | 0 | 2.3 g | 0 | 4.6 g | 1.15 g | 0 |
| Cymel 303 | 0.5 g | 0.5 g | 0.5 g | 0.5 g | 0.5 g | 0.5 g |

Films cast from the solutions prepared in Examples E–J yielded the results listed in Table 18 from the crease test and the mandrel test. Example 5 is included for comparison.

TABLE 18

|  | Epoxy/Novolac | Weight % Epoxy | Crease Test | Mandrel Test |
|---|---|---|---|---|
| Example 5 | 0.25 | 33% | Fail | <0.4% |
| Example E | 0.49 | 34% | Fail | <0.4% |
| Example F | 0.02 | 32% | Fail | <0.4% |
| Example G | 1.00 | 49% | Pass | 1.0% |
| Example H | 0.05 | 45% | Fail | <0.4% |
| Example I | 0.96 | 51% | Fail | <0.4% |
| Example J | 0.97 | 49% | Fail | <0.4% |

Examples E–J demonstrate that by carefully controlling the epoxy/novolac ratio and epoxy weight in the formulation, improved flexibility can be obtained in the absence of stress-modified novolacs or reactive liquid polymers.

Additional Examples Using Gamma-butyrolactone (GBL) As a Carrier Solvent

Examples 12 and Q–V, below illustrate the use of GBL as a carrier solvent.

EXAMPLE 12

Am intermediate solution D was prepared by charging 23.2 kg of SD-7280 phenolic resin and 54.0 kg of methyl ethyl ketone (MEK) into a stainless steel kettle, with mixing. After the SD-7280 had dissolved, 5.1 kg of AT-147 were added followed by a 500 gram rinse of MEK. Next, 349 grams of DMP-30 catalyst were added, followed by a 500 gram rinse of MEK. To this solution was added a slurry of 1.58 kg of Isonate 2143L, followed by a 500 gram rinse of MEK. Finally, 2.1 kg of MEK was added and stirring continued for an hour. The mixture was filtered through a 10 micron bag filter.

EXAMPLES Q–V

Examples illustrate the use of GBL as the make-up solvent. The solutions used to cast a one mil photosensitive layer of the dry film material having the compositions set forth in Table 19 were prepared using the following order of addition. The intermediate solution D and make-up solvent were charged into a clean, polyethylene lined drum and stirred. Next the epoxy resins DEN 431 and optionally EPON 862 were added and the solution mixed for an additional five minutes. The bis-diazoquinone photosensitizer was added to the solution and mixed until dissolved. Next, the epoxy curing agents DDS and phthalic anhydride were added to the solution and mixed until dissolved. Cymel 303 was added to the solution. Finally, Epon 58005 was added with the solution thereafter being mixed for an additional 20 minutes. The solution was then stored in anticipation of casting a photosensitive film layer. It should be noted that this solution has a limited shelf life and should be used preferably within 24 hours of preparation.

TABLE 19

| Example: | Q | R | S | T | U | V |
|---|---|---|---|---|---|---|
| intermediate D | 40.0 g | 40.0 g | 50.0 g | 50.0 g | 50.0 g | 50.0 g |
| GBL | 21.9 g | 17.7 g | 24 g | 21 g | 27 g | 28 g |
| MEK | 0 | 0 | 2 g | 0 | 6 g | 9 g |
| DEN 431 | 17.2 g | 14.4 g | 5.0 g | 12.0 g | 18.0 g | 18.0 g |
| EPON 862 | 0 | 0 | 7.0 g | 0 | 0 | 0 |
| PAC | 3.3 g | 3.2 g | 4.0 g | 4.0 g | 4.0 g | 4.0 g |
| PA | 1.9 g | 1.9 g | 1.2 g | 1.2 g | 1.8 g | 2.4 g |
| DDS | 0 | 0 | 2.3 g | 0 | 0 | 0 |
| Cymel 303 | 0.8 g | 0.8 g | 1.0 g | 1.0 g | 1.0 g | 1.0 g |
| Epon 58005 | 0 | 0 | 3.6 g | 3.4 g | 4.1 g | 6.2 g |

Crease and mandrel test results for films cast from the solutions of Examples Q–V are summarized in Table 20, below. The ratio of functional equivalents of epoxy to novolac and the weight percent epoxy contained in the dry weight of the film are also shown for comparison.

TABLE 20

| | Epoxy/Novolac | Weight % Epoxy | Crease Test | Mandrel Test |
|---|---|---|---|---|
| Example Q | 1.01 | 53% | Pass | 0.4% |
| Example R | 0.82 | 48% | Fail | <0.4% |
| Example S | 0.32 | 30% | Fail | <0.4% |
| Example T | 0.61 | 32% | Fail | 0.4% |
| Example U | 0.88 | 40% | Pass | 0.5% |
| Example V | 0.91 | 38% | Pass | 0.5% |

Examples Q and R demonstrate that pliable, non-flaking films can be obtained from GBL-containing formulations in which the epoxy to novolac ratio and epoxy level is controlled as in Examples E–J. Examples S–V demonstrate that GBL-containing formulations using reactive liquid polymers as in Examples as in Examples O and P can yield pliable, nonflaking films.

Film Formulations Incorporating Rubbers

Incorporating rubbers into our photosensitive dry film formulations can result in less flaking, enhanced film forming, and a desirable increase in film-forming solution viscosity. Each of these improvements is demonstrated by the Examples below.

EXAMPLE 13

Intermediate and photosensitive control solutions were prepared by the procedure of Examples 1 and 3, respectively. The composition of those solutions is set forth in Tables 21 and 22, below.

TABLE 21

| Components | Weight % |
|---|---|
| Acetone | 55.9 |
| SD-7280 | 26.4 |
| DMP-30 | 0.4 |
| Isonate 143L | 1.8 |
| AT-70, 50% solution | 6.4 |
| % Solids | 35 |

TABLE 22

| Component | Weight % |
|---|---|
| Intermediate from Table 21 | 63.6 |
| DEN 431 | 6.4 |
| Epon 862 | 8.9 |
| Bisdiazo | 5.1 |
| Diaminodiphenyl Sulfone | 2.94 |
| Phthalic Anhydride | 1.59 |
| Cymel 303 | 1.27 |
| Acetone | 10.2 |

Photosensitive coatings were prepared in the manner described in Examples 1 through 5. The Example listed as the "Control" was prepared using the photosensitive formulation above. Rubber-containing formulations were then prepared by adding the amounts and types of rubbers shown in Table 23 below to determine if the coated photosensitive dry film exhibited improved performance.

TABLE 23

| Sample | % Rubber | Rubber type | Solvent/Co-solvent | Crease Test | Mandrel Test | % Strain |
|---|---|---|---|---|---|---|
| Control | 0 | None | Acetone | Fail | 1" | 0.4 |
| A | 2.5 | 1072CG | Acetone | Fail | 1" | 0.4 |
| B | 5 | 1072CG | Acetone | Pass | 1" | 0.4 |
| C | 7.5 | 1072CG | Acetone | Pass | ¾" | 0.5 |
| D | 10 | 1072CG | Acetone | Pass | ¾" | 0.5 |
| E | 2.5 | DN-3350 | Acetone | Pass | 1" | 0.4 |
| F | 5 | DN-3350 | Acetone | Pass | 1" | 0.4 |
| G | 7.5 | DN-3350 | Acetone | Pass | 1" | 0.4 |
| H | 10 | DN-3350 | Acetone | Pass | ¾" | 0.4 |
| I | 5 | DN-3350 | Acetone/MEK | Pass | ¾" | 0.4 |
| J | 2.5/2.5 | DN-3350/1300X13 | Acetone/MEK | Pass | 1" | 0.3 |
| K | 2.5/5 | DN-3350/1300X13 | Acetone/MEK | Pass | ¾" | 0.5 |
| L | 5/2.5 | DN-3350/1300X13 | Acetone/MEK | Pass | ¾" | 0.5 |
| M | 5/5 | DN-3350/1300X13 | Acetone/MEK | Pass | ¾" | 0.5 |
| N | 2.5/2.5 | DN-3350/1072CG | Acetone/MEK | Pass | 1" | 0.4 |
| O | 2.5/5 | DN-3350/1072CG | Acetone/MEK | Pass | ¾" | 0.5 |
| P | 5/2.5 | DN-3350/1072CG | Acetone/MEK | Pass | ¾" | 0.5 |
| Q | 5/5 | DN-3350/1072CG | Acetone/MEK | Pass | ¾" | 0.5 |
| R | 2.5/2.5 | DN-3350/1072CG | Acetone/EEP | Pass | ¾" | 0.5 |
| S | 2.5/5 | DN-3350/1072CG | Acetone/EEP | Pass | ¾" | 0.5 |

TABLE 23-continued

| Sample | % Rubber | Rubber type | Solvent/ Co-solvent | Crease Test | Mandrel Test | % Strain |
|---|---|---|---|---|---|---|
| T | 5/2.5 | DN-3350/ 1072CG | Acetone/EEP | Pass | ½" | 0.7 |
| U | 5/5 | DN-3350/ 1072CG | Acetone/EEP | Pass | ½" | 0.7 |
| V | 7.5 | Mowital B-30H | Acetone/MEK | Fail | ¾" | 0.5 |
| W | 10 | Mowital B-30H | Acetone/MEK | Fail | ½" | 0.7 |
| X | 10 | Ricon 131MA10 | Acetone | Pass | 1" | 0.4 |
| Y | 10 | Epon 58005 | Acetone/MEK | Fail | ½" | 0.7 |
| Z | 5/5 | DN-3350/ Pbd605 | Acetone/MEK | Pass | | |
| AA | 5/5 | DN-3350/ 1300X8 | Acetone/MEK | Pass | | |
| BB | 5/5/2.5 | 3350/ 1300X13/ R45HT | Acetone/MEK | Pass | | |

Resins referred to in Table 23, above include Nipol 1072 CG, butadiene-acrylonitrile rubber from Zeon Chemicals Inc. of Louisville, Ky., Nipol DN-3350, a butadiene-acrylonitrile rubber also available from Zeon, Mowital B-30H, a polyvinyl butyral available from Celanese Corp. of Charlotte, N.C., Ricon 131 MA10, a maleinized polybutadiene available from Ricon Resin, Inc. of Grand Junction, Colorado, Epon 58005, a reacted product of butadiene acrylonitrile with epoxy, available from Shell Chemical Company of Houston, Tex., Hycar CTBN13X8, a carboxyl-terminate butadiene-acrylonitrile available from BF Goodrich, Cleveland, Ohio, Hycar CTBN13X13, a carboxyl terminated butadiene-acrylonitrile also available from Goodrich, PDF 605, an epoxidized hydroxyl-terminated polybutadiene available from Elf Atochem of Philadelphia, Pennsylvania and R45HT, a hydroxyl-terminated polybutadiene also available from Elf Atochem.

Where the use of a cosolvent is indicated in Table 23, the cosolvent was present at 20 weight percent of the solvent system.

As can be seen from comparing samples A through BB to the control sample, rubber-modified solutions provided superior results to the control sample.

As used herein, the term "rubber" means a cross-linkable polymer containing butadiene, having a Tg lower than room temperature, and a Mooney viscosity of 20 to 60. Rubber types useful in our invention include butadiene and butadiene-acrylonitrile rubbers, including functionalized varieties thereof, as well as butyl rubbers. Butadiene-acrylonitrile rubbers with a Mooney viscosity from about 20 to 60 are preferred. Rubber loading of the PS solution can range from 1% to 15% based on total dry weight of the dry film layer, with the preferred loading being in the range of from about 2.5 to 7.5%.

Use of rubber-modified formulations also has been shown to improve the film forming properties of solutions used to form dry films in accordance with our invention. This improvement is demonstrated in Example 14, below.

EXAMPLE 14

Intermediate and photosensitive solutions were prepared as described in the previous example using the formulations given in Tables 24 and 25, below.

TABLE 24

| Components | Weight % |
|---|---|
| Acetone | 61.71 |
| SD-7280 | 35.37 |
| DMP-30 | 0.56 |
| Isonate 143L | 2.36 |
| % Solids | 38.29 |

TABLE 25

| Component | I | II | III | IV | Control |
|---|---|---|---|---|---|
| Intermediate solution from Table 24 | 67.8 | 67.8 | 67.8 | 67.8 | 67.8 |
| DEN 431 | 6.78 | 6.78 | 6.78 | 6.78 | 6.78 |
| Epon 862 | 9.49 | 9.49 | 9.49 | 9.49 | 9.49 |
| Bisdiazo | 5.43 | 5.43 | 5.43 | 5.43 | 5.43 |
| DDPS | 3.11 | 3.11 | 3.11 | 3.11 | 3.11 |
| PA | 1.69 | 1.69 | 1.69 | 1.69 | 1.69 |
| Cymel 303 | 1.35 | 1.35 | 1.35 | 1.35 | 1.35 |
| Nipol DN 3350 solution (25 wt % in MEK) | 5.4 | 10.8 | 16.2 | 21.6 | 0 |
| MEK | 14.6 | 18.9 | 14.8 | 10.8 | 11.3 |
| Acetone | 24.4 | 24.3 | 23 | 21.6 | 13.3 |
| % Nipol | 2.5 | 5 | 7.5 | 10 | 0 |

As can be seen from Table 25, samples I through IV employed varying amounts of Nipol DN 3350 butadiene-acrylonitrile rubber to replace acrylic and provide cracking resistance. The results from dry films made from Sample I through IV and subsequently photoprocessed are given in Table 26, below.

TABLE 26

| Formulation | Control | I | II | III | IV |
|---|---|---|---|---|---|
| Coatability | Failed to coat | Coat well, good quality | Coat well, good quality | Coat well, good quality | Coat well, good quality |
| 2 mil vias | open | open | open | open | not open |
| Crease test | Fail | pass | pass | pass | pass |
| Mandrel test | 1" | 1" | ¾" | ¾" | ½" |

As can be seen from the results of Table 26, samples II and IIII (5 and 7.5% rubber) yielded open 2 mil vias, passed the crease test, and passed the mandrel test at ¾" mandrel diameter.

The viscosity of solutions I through IV above was favorably affected by the addition of rubber modifier as illustrated by the data in Table 27, below. While the control formulation exhibited a relatively low viscosity of 46 cPs, addition of rubber modifier increased the viscosity of the solution to a point where it was more easily retained by the substrate and where he solution exhibited a diminished tendency to backflow under coating conditions.

TABLE 27

| Formulation | Control | I | II | III | IV |
|---|---|---|---|---|---|
| Viscosity (cPs) | 46 | 62 | 70 | 92 | 130 |

Etchable and Sacrificial Fillers

Dry film materials in accordance with our invention can be somewhat chemically resistant to typical etchants known to be useful for preparing a cured dry film surface for plating. Plating also is sometimes difficult because the highly uniform cured surface produced by our dry film materials has insufficient texture for plating.

We have found that the platability of our dry film materials can be enhanced by incorporating non-etchable or sacrificial fillers into the formulation used to produce the dry film material. In both cases, platability is enhanced by increasing the texture of the surface to be plated.

Non-etchable fillers promote platability by providing particles that are relatively non-etchable in etching solution when compared to the other components of dry film dielectric material. The nonetchable particles remaining on the etched dry film surface provide anchor sites for plated metal.

Etchable or sacrificial fillers promote platability by providing particles that are relatively more etchable in etching solution than the other components of dry film dielectric material. Etchable fillers are eroded away more rapidly than the dry film material, leaving a pitted surface to which plating metals can more readily adhere.

In both cases, platability is enhanced because the dry film layer includes materials that respond to the etchant at different rates, thereby yielding a more highly textured surface than would be obtained by etching a dry film system that did not contain a sacrificial or non-etchable filler.

Sacrificial or non-etchable filters can be any organic or inorganic component that can be successfully incorporated in the dry film solution and plated without adversely affecting other properties of the dry film system. Non-etchable fillers typically will have a mean particle diameter no greater than 10 microns, and preferably will have a particle size from 0.5 to 2.0 microns. Sacrificial fillers should be selected to yield pits in the etched surface having a mean diameter of up to 10 microns, and preferably from 0.5 to 2.0 microns. The fillers typically will be incorporated in the dry film solution in an amount of from about 1 to 50 percent of the film's dry weight, and preferably from between 10 to 25 percent of the film's dry weight.

Etching conditions and reagents can be any conditions and chemicals compatible with the selected dry film chemistry and which can produce the differential etching required to exploit the benefit of the sacrificial or non-etchable filler under the etching conditions selected. For example, etching solution useful for processing dry film materials incorporating sacrificial or nonetchable fillers can be prepared from sodium hydroxide and potassium permanganate. A preferred etching solution is 40 grams per liter of sodium hydroxide and 65 grams per liter of potassium permanganate in deionized water. A cured film should be etched in this solution at about 180 degrees Fahrenheit for about 5 to 30 minutes to provide a highly textured surface suitable for use in electroless or electrolytic plating processes. Etching time effects the amount of texture on the dry film surface, and should be empirically adjusted to yield a surface having the desired texture.

Preferred non-etchable fillers useful in our dry film systems include aluminum oxide, solid glass microspheres, hollow glass microspheres, hollow ceramic microspheres, milled glass, and fumed silica.

Preferred sacrificial fillers useful in our dry film systems include polyimides, polyamide-imides, polyethylene terephthalate, epoxies, and polycarbonates. Of these fillers, polyimides and polyamide-imides are most preferred.

While the foregoing detailed description focused on the production of multilayer printed wiring boards using a bilayer film, other uses of the invention will be apparent to those skilled in the art. Our invention is therefore intended to be limited only by the scope of the following claims.

We claim:

1. A composition for forming a polymeric layer useful in the production of printed wiring boards, said composition comprising:
    a volatile organic carrier solvent for mixing and casting the polymeric layer onto a surface;
    an epoxy resin in the amount of 20 to 60 weight percent of the nonvolatile components of said layer; and
    a basic catalyst in the amount of 0.01 to 5 weight percent of the nonvolatile components of said layer; and
    a film-forming polymer adduct totaling between 10 and 50 weight percent of the nonvolatile components of said layer.

2. The composition of claim 1 wherein the film-forming polymer adduct includes a polyfunctional nucleophile capable of reacting with an epoxide.

3. The composition of claim 2 further including a component selected from the group consisting of modified phenolic resins, reactive liquid polymers, and rubbers.

4. The composition of claim 2 further wherein the film-forming polymer adduct comprises a stress modified novolac and wherein an epoxy to novolac ratio of the composition is between about 0.7 and 1.1.

5. The composition of claim 2 wherein the film-forming polymer adduct comprises a reactive liquid polymer and wherein an epoxy to novolac ratio of the composition is between about 0.7 and 1.0.

6. The composition of claim 2 wherein the film-forming polymer adduct comprises a rubber and wherein an epoxy to novolac ratio of the composition is between about 0.7 and 1.1.

7. The composition of claim 2 wherein the epoxy to novolac ratio of the composition is between about 0.7 and 1.1 and wherein the epoxy resin comprises between 40 and 55 weight percent of the nonvolatile components of the composition.

8. The composition of claim 7 wherein the composition is free of stress modified phenolic resins, reactive liquid polymers, and rubbers.

9. The composition of claim 1 further including a positive-acting photosensitive compound comprising between 2 and 20 weight percent of the nonvolatile components of the composition.

10. A laminable dry film useful for forming a permanent dielectric area on a generally planar printed wiring board surface, said surface having circuit board elements attached to and rising above the wiring board planar surface, said film comprising:
    a dried first thermosetting polymeric layer cast from the composition of claim 1 for adhering the film to the printed wiring board surface and for encapsulating the circuit board elements, said first layer being soluble in aqueous alkaline solution and deposited on a carrier sheet;
    a second thermosetting polymeric layer cast from the composition of claim 1, additionally comprising a positive-acting photosensitive compound comprising between 2 and 20 weight percent of the nonvolatile components of the composition, and adhered to said first layer.

11. The film of claim 10 wherein the glass transition temperature of the cured first and second thermosetting layers is greater than 100 degrees Centigrade.

12. The film of claim 10 wherein the first or second thermosetting layer additionally comprises a film-forming polymer adduct which comprises a polyfunctional nucleophile capable of reacting with an epoxide and a component selected from the group consisting of stress modified phenolic resins, reactive liquid polymers, and rubbers.

13. The film of claim 10 wherein the first or second thermosetting layer comprises a film-forming polymer adduct which comprises a stress modified novolac polyfunctional nucleophile capable of reacting with an epoxide and wherein the epoxy to novolac ratio is between about 0.7 and 1.1.

14. The film of claim 10 wherein the first or second thermosetting layer comprises a reactive liquid polymer film-forming polymer adduct which comprises a polyfunctional nucleophile capable of reacting with an epoxide and wherein the epoxy to novolac ratio is between about 0.7 and 1.0.

15. The film of claim 10 wherein the first or second thermosetting layer comprises a rubber film-forming polymer adduct which comprises a polyfunctional nucleophile capable of reacting with an epoxide and wherein the epoxy to novolac ratio is between 0.7 and 1.1.

16. The film of claim 10 wherein the first or second thermosetting layer comprises a film-forming polymer adduct which includes a polyfunctional nucleophile capable of reacting with an epoxide and wherein the epoxy to novolac ratio is between 0.7 and 1.1 and the epoxy resin comprises between 40 and 55 weight percent of the non-volatile components of the composition.

17. The composition of claim 1 further including a comonomer of the epoxy resin selected from the group consisting of carboxylic acid anhydrides and aromatic diamines.

18. The composition of claim 1 further including an aminoplast selected from the group consisting of glycolurils and melamine-formaldehyde addition products.

19. The composition of claim 9 wherein the positive-acting photosensitive compound is selected from the group consisting of ortho-napthoquinone diazides.

20. The composition of claim 1 further including a sacrificial or non-etchable filler for increasing the texture of said composition after the composition is dried and etched prior to a plating a metal onto the dried composition.

21. The composition of claim 1 deposited onto a release coated carrier sheet and dried to remove at least 80 percent of the volatile carrier solvent to yield a non-tacky film.

22. A method for manufacturing a bi-layer film useful as a permanent dielectric in the production of printed wiring boards, the method comprising the steps of:

casting a film-forming composition of claim 1 onto a first film carrier sheet to form a dried first thermosetting polymer layer on said first sheet;

casting a film-forming composition comprising the composition of claim 1 and further including a photosensitive agent onto a second carrier sheet to form a dried second thermosetting polymer layer on said second sheet; and forming a bilayer film by joining said first carrier sheet and film layer to said second carrier sheet and film layer by placing said first and second film layers adjacent each other and laminating the first and second sheets together.

* * * * *